(12) United States Patent
Jin

(10) Patent No.: US 6,825,544 B1
(45) Date of Patent: Nov. 30, 2004

(54) METHOD FOR SHALLOW TRENCH ISOLATION AND SHALLOW TRENCH ISOLATION STRUCTURE

(75) Inventor: Bo Jin, Campbell, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/207,713

(22) Filed: Dec. 9, 1998

(51) Int. Cl.$^7$ ............................................. H01L 29/00
(52) U.S. Cl. .................. 257/499; 257/501; 257/506; 257/510; 438/221; 438/296; 438/424; 438/426; 438/701; 438/713
(58) Field of Search ................. 438/221, 296, 438/424–426, 437, 701, 713, 978; 257/499, 501, 506, 510, 513

(56) References Cited

U.S. PATENT DOCUMENTS

| | | | | |
|---|---|---|---|---|
| 5,726,093 A | * | 3/1998 | Yoo ........................... 438/443 |
| 5,731,241 A | | 3/1998 | Jang et al. |
| 5,807,789 A | * | 9/1998 | Chen et al. ................. 438/714 |
| 5,811,345 A | | 9/1998 | Yu et al. |
| 5,858,857 A | * | 1/1999 | Ho ............................. 438/424 |
| 5,880,004 A | * | 3/1999 | Ho ............................. 438/421 |
| 6,017,800 A | * | 1/2000 | Sayama et al. ............. 438/296 |
| 6,081,662 A | * | 6/2000 | Murakami et al. ...... 395/500.35 |
| 6,165,843 A | * | 12/2000 | Sung ........................... 438/258 |
| RE37,158 E | * | 5/2001 | Lee ............................. 438/289 |
| 6,245,684 B1 | * | 6/2001 | Zhao et al. ................. 438/704 |
| 6,251,748 B1 | * | 6/2001 | Tsai ............................ 438/425 |
| 6,255,682 B1 | * | 7/2001 | Wu ............................. 257/301 |

* cited by examiner

*Primary Examiner*—Hsien Ming Lee
(74) *Attorney, Agent, or Firm*—Bradley T. Sako

(57) ABSTRACT

Shallow trench isolation methods and corresponding structures are disclosed. According to one embodiment (900) a nitride layer (1006), having an opening (1014), is formed over a silicon substrate (1002). The portion of the substrate (1002) below the opening (1014) is oxidized to form a substrate consuming rounding oxide layer (1018). The formation of the rounding oxide layer (1018) results in rounded edges in the substrate (1002). An isotropic, or alternatively, an anisotropic rounding oxide etch removes the rounding oxide layer (1018) to expose the substrate (1002). A trench (1026) can be formed by applying a silicon etch using the nitride layer (1006) as an etch mask. The trench (1026) can be subsequently filled with a deposited trench isolation material (1030).

20 Claims, 16 Drawing Sheets

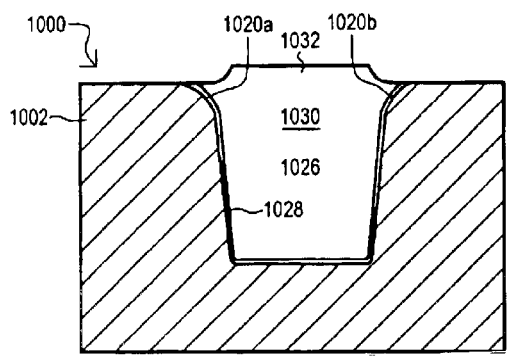 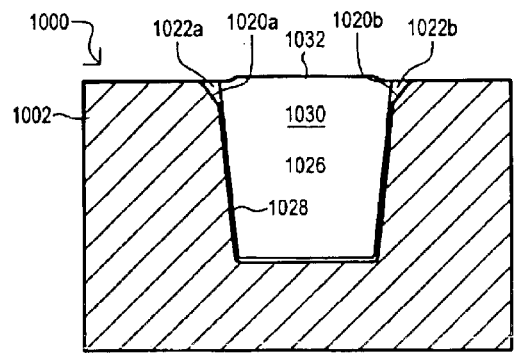
FIG. 10H-1    FIG. 10H-2

METHOD FOR SHALLOW TRENCH ISOLATION AND SHALLOW TRENCH ISOLATION STRUCTURE

TECHNICAL FIELD

The present invention relates generally to isolation structures for integrated circuits, and more particularly to shallow trench isolation methods and structures.

BACKGROUND OF THE INVENTION

Integrated circuit devices typically include a number of active devices, such as transistors, that are separated from one another by isolation structures. Isolation structures help to ensure that active devices can be individually controlled by preventing current flow between adjacent devices. Without sufficient isolation, leakage paths can occur between active devices, leading to a number of undesirable effects. Such undesirable effects can include increased power dissipation, increased susceptibility to latch-up, unstable logic states, and decreased noise margins.

Integrated circuits are often manufactured with generational decreases in device sizes. That is, while an initial manufacturing process may be capable of fabricating active devices with an initial minimum feature size, as processing technology progresses, the minimum size continues to decrease. As just one example, a process may initially be capable of fabricating insulated gate transistors having a minimum gate length of 0.5 microns ($\mu$m). With improvements in process technology, smaller gate lengths are possible. For example, gate lengths of 0.25 or 0.21 $\mu$m can be achieved.

Decreases in minimum active device size can result in integrated circuit devices designs being subjected to generational "shrinks." Generational shrinks involve using an existing basic design, but then shrinking the structures within the design according to process improvements. Each shrink can result in an integrated circuit having an overall smaller physical size. Smaller integrated circuit sizes allow more integrated circuits to be fit on a wafer, which can result in a more cost-effective production.

While process improvements can allow for the shrinking of certain device structures, other device structures are not always capable of being reduced in size. In particular, as device features ("geometries") continue to shrink, it can be increasingly more difficult to achieve a corresponding shrink in an isolation structure.

One type of isolation structure that is commonly employed in integrated circuits that are fabricated on a silicon substrate, is the local oxidation of silicon "LOCOS." LOCOS involves placing a barrier layer (silicon nitride for example) over the semiconductor substrate. Openings are then formed in the barrier layer. The exposed portion of the silicon substrate is oxidized to create a silicon dioxide "field oxide." The field oxide has tapered edges ("bird's beak") that extend under edges of the barrier layer, encroaching into the active portions of the substrate. The encroachment can result in larger isolation structures in the lateral direction (parallel to the semiconductor substrate). For this reason, LOCOS-type isolation can be undesirable.

In addition to extending in a lateral direction, LOCOS structures can extend in the vertical direction, above the substrate. Consequently, LOCOS structures can add to the topography of semiconductor device. Additional topography can be undesirable as it can complicate subsequent patterning step. Furthermore, because LOCOS is essentially "grown" in the oxide, smaller lateral dimensions correspond to smaller vertical dimensions. Accordingly, while LOCOS structures having smaller lateral features can be formed, such structures will have very small vertical depth. LOCOS structures having too small a vertical depth, provide less reliable isolation, and are more susceptible to functioning as a parasitic transistor, in the event a conductive line is situated over the LOCOS structure.

An alternative to LOCOS, and LOCOS-type isolation is shallow trench isolation (STI). Conventional STI approaches involve etching a trench into a substrate, and then filling the trench with an isolation material. In this way, lateral and vertical dimensions of an isolation structure can be established by an etch step. While conventional STI approaches can result in smaller isolation structures, such approaches can have drawbacks. To better understand these drawbacks, a conventional STI method and associated structure will now be described.

Referring now to FIG. 1, a flow diagram is set forth that describes a conventional STI method. The conventional STI method is used to form an isolation structure in a silicon substrate. The method set forth in the flow diagram is designated by the general reference character 100 and is shown to include a number of steps, each of which involves one or more fabrication steps. FIGS. 2A–2G are side cross-sectional views illustrating the formation of a conventional STI structure made according to the method set forth in FIG. 1.

The flow diagram 100 is shown to include a "Thin Oxide/Nitride Deposition" step 102. Step 102 involves forming a thin silicon dioxide ("oxide") layer on a silicon substrate, and then depositing a silicon nitride ("nitride") layer over the oxide layer. FIG. 2A sets forth a side cross-sectional view of a conventional STI structure following step 102. The STI structure is designated by the general reference character 200, and is shown to include a silicon substrate 202. A relatively thin layer of oxide 204 has been formed on the silicon substrate 202. Deposited over the relatively thin layer of oxide 204 is a layer of nitride 206.

Following step 102, the STI flow diagram 100 continues with a "Photo Pattern" step 104. Step 104 involves forming an etch mask over the nitride layer using photolithographic steps. A side cross-sectional view of the STI structure 200 following step 104 is set forth in FIG. 2B. The resulting etch mask is shown to include developed photoresist ("resist") 208 formed over an anti-reflective coating (ARC) 210. The ARC 210 can reduce corner reflections that result in unwanted rounding of pattern corners or other undesirable results. An etch mask opening 212 is formed within the resist 208 and the ARC 210, resulting in a portion of the nitride layer 206 being exposed.

Following step 104, the conventional STI flow diagram 100 continues with a "Nitride Etch (stop on oxide)" step 106. Step 106 involves applying a silicon nitride etch that results in the removal of that portion of the nitride layer that is exposed by the resist pattern 208. A side cross-sectional view of the STI structure 200 following step 106 is set forth in FIG. 2C. The opening 212 following the silicon nitride etch is shown to extend through the nitride layer 206 to the relatively thin oxide layer 204. Also set forth in FIG. 2C, by dashed lines, are residual nitride "particles" 214 within the etch mask opening 212. Such particles can arise despite concerted efforts to have as clean a process as possible.

Following step 104, the STI flow diagram 100 continues with a "Si Etch (Form the trench in Si substrate)" step 108.

Step 108 involves applying a silicon etch. FIG. 2D sets forth a side cross-sectional view of the STI structure 200 following step 108. The silicon etch has formed a silicon trench 216 below the etch mask opening 212. Also set forth in FIG. 2D, by dashed lines, are "micro-masking" defects 218 arising from the particles 214 formed in the previous nitride etch step. The nitride particles 214 function essentially as etch masks during the silicon etch, and can result in undesirable uneven topography in the bottom of a silicon trench, including silicon "pillars."

Following the silicon etch (step 108), a "Liner Oxidation" step 110 is performed. Liner oxidation involves forming a relatively thin layer of oxide on the exposed surfaces of a trench in the silicon substrate. FIG. 2E sets forth a side cross-sectional view of the STI structure 200 following step 110. The resulting thin oxide layer 220 can be considered a "liner oxide," as it lines the vertical and horizontal surfaces within the trench 216. As shown by dashed lines in FIG. 2E, the liner oxide 220 can be formed on micro-masking defects 218.

Following the creation of the liner oxide 220, the flow chart 100 continues with an "HDP Gap Fill/Dens," step 112. Step 112 involves depositing an oxide layer with a high density plasma (HDP) to fill the gaps (trenches) created by the silicon etch step 108. Following the oxide deposition, the deposited oxide is then densified (DENS). FIG. 2F sets forth a side cross-sectional view of the STI structure 200 following step 112. An HDP oxide is designated by the reference character 222 and is shown to extend over, and into the trench 216.

The last step set forth in the flow chart 200 is a "CMP/Nitride Strip" step 114. Step 114 involves chemical mechanical polishing (CMP) and the removal of nitride situated over the silicon substrate. FIG. 2G sets forth a side cross-sectional view of the STI structure 200 following step 114. The STI structure 200 includes a trench isolation 224 formed by the liner oxide and remaining HDP oxide. In addition, due to the CMP process, the trench isolation 224 includes a portion (a "stud") 226 that extends above the substrate 202 surface. The previous trench etching step in combination with the CMP operation results in relatively sharp corners 228a and 228b formed at the junction of the vertical walls of the trench and the horizontal substrate surface. Also identified in FIG. 2G are corner oxide portions 230a and 230b. The corner oxide portions (230a and 230b) are those portions of the trench isolation 224 that are adjacent to the relatively sharp corners (228a and 228b).

As noted above, the conventional STI structure 200 set forth in FIG. 2G can be susceptible to a number of drawbacks. In particular, the relatively sharp corners (228a and 228b) can result in increased stress on the corners. Increased stress can result in increased numbers of dislocations in the silicon crystal lattice structure making up the relatively sharp corners (228a and 228b). Increased dislocations can result in increased leakage current. The relatively sharp corners will also produced increased electric fields. Increased electrical fields can produce more leakage current and/or decrease the overall reliability of an integrated circuit.

The thickness of the corner oxide portions (230a and 230b) can also affect an integrated circuit. Thin corner oxide portions (228a and 228b) can result in less insulation for the corners from subsequently deposited conductive layers. Less insulation at the relatively sharp corners (228a and 228b) can further increase leakage and/or reduce reliability.

Increased leakage current will result in increased power consumption and increased stand-by current. In the event metal-oxide-semiconductor (MOS) transistors are separated by conventional STI structures 200, increased leakage current can manifest itself as sub-threshold current. Such sub-threshold current will often introduce a "hump" in the sub-threshold current response of a MOS transistor.

The conventional STI approach described in FIG. 1 and FIGS. 2A–2G, can also produce micro-masking defects, such as those illustrated by the reference character 218. Such defects can result in inadequate isolation and/or adversely affect the reliability of the resulting integrated circuit.

It is also noted that the resulting conventional STI structure 226 produces a trench isolation 224 having a stud 226. The stud 226 extends above the surface of the substrate 202. The stud 226 can introduce topographical variations into subsequent deposited layers. Such variations (e.g., uneven surfaces) can adversely affect patterning of subsequently deposited layers. As just one example, a polysilicon layer can be deposited after the formation of the STI structures. The polysilicon layer will then have to be patterned to form gates for MOS transistors. The topography introduced by overly large trench isolation studs 226 can adversely effect the patterning of gate structures. Consequently, resulting gate structures can be too wide or too narrow.

Accordingly, while a conventional STI approach can produce isolation structures having smaller geometries, such structures can have drawbacks.

To further understand the various embodiments that will be described, a further discussion of general semiconductor device manufacturing, for both discrete and integrated circuits, will be discussed. Most semiconductor device manufacturing processes involve a series of steps that deposit and/or pattern multiple layers. Often such steps are restrictive, in that the steps can only be performed in a certain way, or by a certain machine. As just one example, etching steps for certain materials can be performed by a "wet" chemical etch, or by a "dry" plasma etch. In the event the etching step involved in creating a semiconductor device can be performed by either a dry etch or a wet etch, the manufacture of the semiconductor device is more flexible. Consequently, the semiconductor device can be more amenable to being manufactured at different facilities, or less susceptible to slow production times, by being overly dependent upon a particular manufacturing step.

Another feature of a semiconductor device is process integration flexibility. When a semiconductor memory device is manufactured, the structure produced by one manufacturing step can be adversely affected by subsequent process steps. This can result in a process in which step must be very subject to tight controls (have narrow process margins). One such structure in the conventional STI structure is the corner oxide portions (230a and 230b) set forth in FIG. 2G. Once a conventional STI structure is formed, the corner oxide portions (230a and 230b) are susceptible to thing by any subsequent etching steps. Accordingly, subsequent etching steps must be tightly controlled to prevent over-etching of the corner oxide portions (230a and 230b). In this way, the corner protection afforded by conventional STI approaches can result in reduced process margins.

Yet another feature of semiconductor device manufacturing processes is the number of discrete manufacturing steps required to form a semiconductor device structure. Reducing the number of steps in a manufacturing process can increase the number of devices that can be produced in a given time period (throughput) and reduce the overall cost involved in manufacturing each device. A similar manufacturing feature that should also be considered is manufacturing simplicity.

Manufacturing simplicity can include performing multiple manufacturing steps with the same piece of equipment. Such manufacturing simplicity can also increase throughput and reduce cost.

One way to reduce manufacturing steps and/or simplify manufacturing, while at the same time providing small geometry structures, is to use self-aligned steps. Self-aligned steps typically involve using one mask structure for multiple process steps. For example, a self-aligned contact will use one mask to both define a contact opening and form a substrate contact in the opening.

In light of the advantages of STI structures in reducing the size of an integrated circuit, it would be desirable to provide some way of forming an STI structure that differs from conventional approaches. It would also be desirable to provide such an alternate STI method that does not include one or more of the drawbacks inherent in many conventional STI approaches. It would also be desirable to arrive at an STI approach that has process flexibility, or increased process margins, or reduced manufacturing steps, or increased manufacturing simplicity.

SUMMARY OF THE INVENTION

According to the disclosed embodiments, a number of trench isolation methods are disclosed. According to one aspect of the disclosed embodiments, a trench isolation method includes forming a barrier mask over a substrate. The barrier mask has an opening that exposes a portion of the substrate. A substrate consuming layer is formed over the exposed portion of the substrate forming rounded corners in the substrate. The substrate consuming layer is removed, resulting in a gouge within the substrate surface that includes the rounded corners. A trench is formed within the gouge so that the trench edges include the rounded edges formed by the substrate consuming layer.

According to another aspect of the disclosed embodiments, a trench isolation method includes forming an etch mask layer over a substrate. The etch mask layer is patterned with an etch step to form an opening in the etch mask. A substrate consuming layer is formed on the portion of the substrate exposed by the etch mask. The substrate consuming layer is then subsequently removed. The formation and removal of the substrate consuming layer can remove defect introduced by the etch step used to pattern the etch mask.

According to another aspect of the disclosed embodiments, a trench isolation method includes forming a barrier mask over a substrate. The barrier mask has an opening that exposes a portion of the substrate. A substrate consuming layer is formed over the exposed portion of the substrate. The barrier mask limits the lateral extents of the substrate consuming layer, and results in portions of the substrate consuming layer ("encroaching portions") extending under the barrier mask. Portions of the substrate consuming layer are removed with a substantially anisotropic etch, resulting in the removal of the majority of the substrate consuming layer, but the preservation of the encroaching portions. A trench is then etched in the substrate using the barrier mask as an etch mask. The resulting trench has corners that are protected by the encroaching portions.

According to another aspect of the embodiments a shallow trench isolation structure includes a trench formed in a silicon substrate. The trench has sides that are connected to the substrate surface by rounded edges. An encroaching portion, formed from thermal silicon dioxide, is formed over the rounded edges. The remainder of the trench is filled with a trench isolation material.

An advantage of at least one of the disclosed embodiments is that it provides a trench isolation structure having a trench with rounded corners.

Another advantage of at least one of the disclosed embodiments is that it provides a trench isolation method that can remove particles or other defects that can adversely affect a trench etch step.

Another advantage of at least one of the disclosed embodiments is that it provides a trench isolation structure having a trench with additional insulation protection over the trench edges.

Another advantage of at least one of the disclosed embodiments is that it can provide a trench isolation structure having less topography than some conventional trench isolation approaches.

Another advantage of at least one of the disclosed embodiments is that it can provide a trench isolation method that is self-aligned.

BRIEF DESCRIPTION OF THE DRAWINGS

FIGS. 10A to 10H-2 are side cross-sectional views of a STI structure made according to method steps described in FIG. 9.

DETAILED DESCRIPTION OF THE EMBODIMENTS

Various embodiments of the present invention will now be described in conjunction with a number of figures. The figures include flow diagrams that set forth a number of steps involved in forming a shallow trench isolation (STI) structure in a substrate material. Associated with each flow diagram are a series of side cross-sectional views of a single STI structure.

Figure 3:
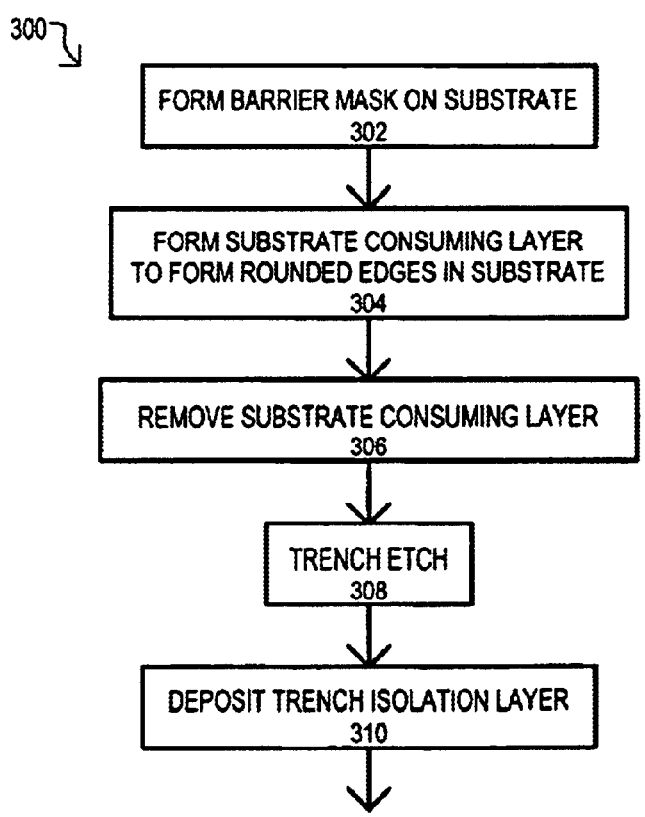
FIG. 3 is a flow diagram illustrating a STI method according to a first embodiment.
Figure 4A:
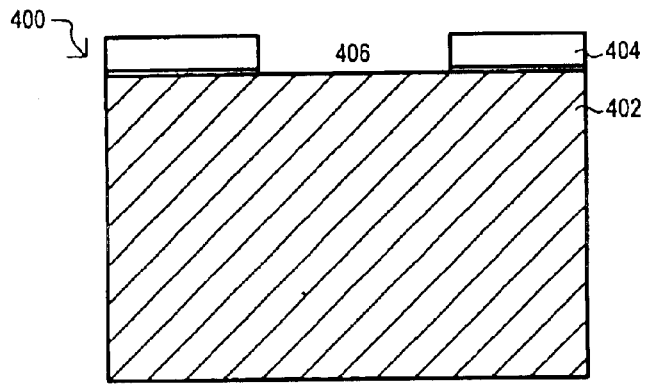
FIGS. 4A to 4E are side cross-sectional views of a STI structure according to method steps described in FIG. 3.

Referring now to FIG. 3, a first embodiment is described in a flow diagram, and designated by the general reference character 300. The first embodiment 300 includes a "Form Barrier Mask" step 302. A step 302 can include forming a barrier mask over a substrate. A barrier mask can include a number of openings over the positions where a trench is to be formed. One example of a device following step 302 is set forth in a side cross-sectional view in FIG. 4A. A sample device is designated by the general reference character 400 and is shown to include a substrate 402. A barrier mask 404 having an opening 406 is formed over substrate 402. Opening 406 exposes a portion of substrate 402 where an isolation trench can be formed.

Figure 4B:
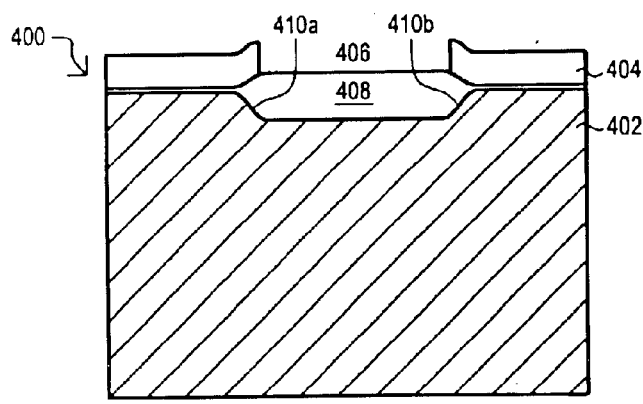

Flow diagram 300 is shown to further include a "Form Substrate Consuming Layer To Form Rounded Edges In Substrate" step 304. A step 304 can include creating material on an exposed surface of a substrate that consumes a portion of the substrate. Once portions of the substrate are consumed, a resulting structure will include a substrate surface having rounded edges. One example of a device following step 304 is set forth in a side cross-sectional view in FIG. 4B. Substrate consuming material is shown as item 408, and in the particular example of FIG. 4B, is shown to extend into substrate 402 in a vertical direction. In addition, substrate consuming material 408 extends in a lateral direction under etch mask layer 404. In the particular arrangement of FIG. 4B, mask layer 404 may turn upward at edges of opening 406. The consumption of substrate material in a vertical and lateral direction can result in rounded edges 410a and 410b within substrate 402.

Figure 4C:
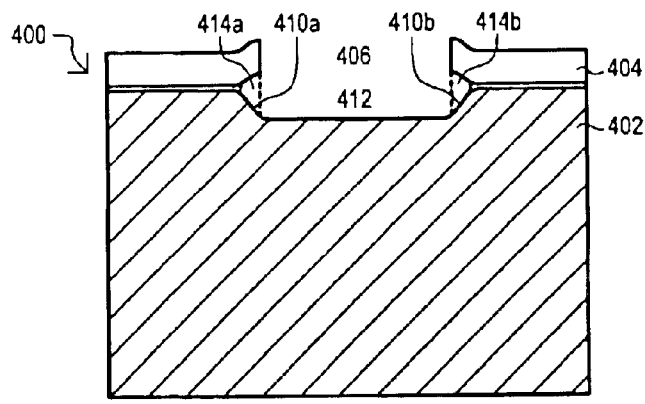

Flow diagram 300 also includes a "Remove Substrate Consuming Layer" step 306. A step 306 can include removing a substrate consuming layer by etching or the like. Once a substrate consuming layer is removed, inset gouges within the substrate can result, that have rounded edges. One example of a device following step 306 is set forth in a side cross-sectional view in FIG. 4C. Substrate consuming material 408 has been removed forming a gouge 412 within a substrate 402. The gouge 412 includes rounded edges (410a and 410b). It is noted that in the particular arrangement of FIG. 4C, areas above rounded trench corner edges (410a and 410b) may or may not include residual substrate consuming layer portions (encroaching portions) 414a and 414b, depending upon the etch process used. As just a few examples, an isotropic etch may remove all, or a substantial amount of any encroaching portions (414a and 414b). An anisotropic etch may remove none or an insubstantial amount of any encroaching portions (414a and 414b).

Figure 4D:
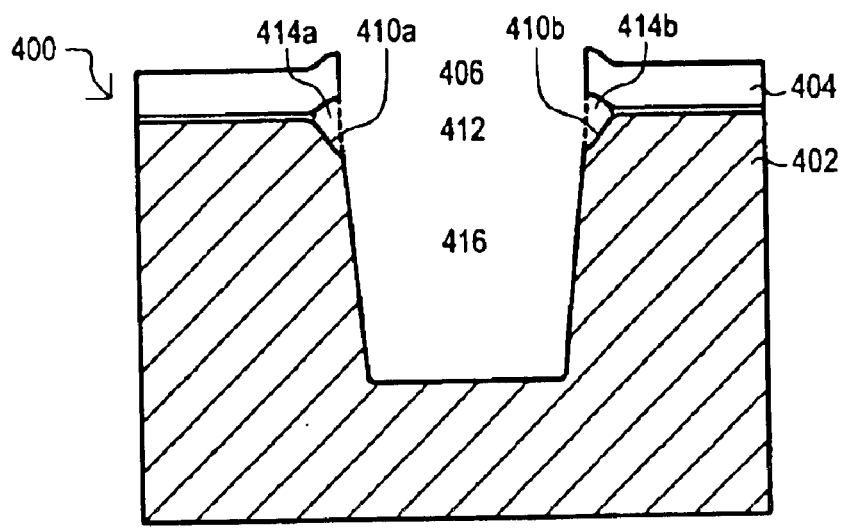

Another step set forth in FIG. 3 is a "Trench Etch" step 308. A step 308 can include etching a trench into a substrate using a previously formed barrier layer as an etch mask. Substrate material below an etch mask is removed creating, an isolation trench. One example of a device following step 308 is set forth in a side cross-sectional view in FIG. 4D. Portions of a substrate 402 below opening 406 are removed, resulting in a trench 416. A trench 416 can include rounded trench edges (410a and 410b) formed by previous steps, as described. Furthermore, residual portions (414a and 414b) may remain according to previous etch steps.

Figure 4E:
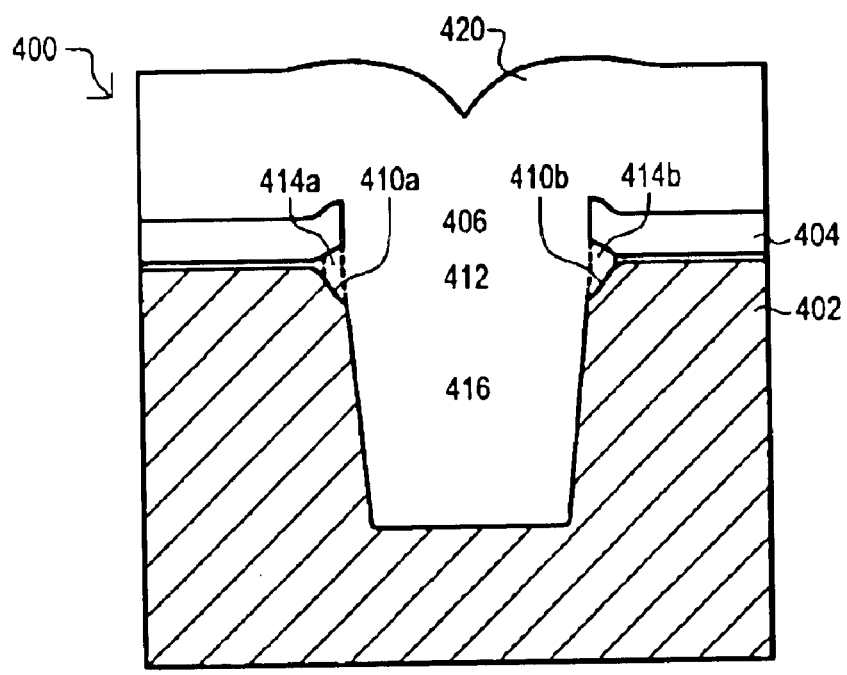

The first embodiment 300 also includes a "Deposit Trench Isolation Layer" step 310. A step 310 can include depositing a trench isolation layer that fills trenches within a substrate. One example of a device following step 310 is set forth in a side cross-sectional view in FIG. 4E. A trench isolation material 420 has been deposited that fills a trench in a substrate 402. A trench 416 can include rounded trench edges (410a and 410b) formed by previous steps, and may or may not include residual portions (414a and 414b) over trench edges (410a and 410b).

Rounded trench edges (410a and 410b) that can be generated by the first embodiment 300 can reduce stress on the edge of a trench and thereby reduce dislocations. Reductions in dislocations can reduce leakage current. Reduced leakage currents can reduce power consumption, and/or alleviate adverse active device responses. One example of an adverse active device response is a "hump" in the subthreshold leakage current of an insulated gate field effect transistor (IGFET).

Referring now to FIG. 5 and FIGS. 6A–6F, a second embodiment is described in a flow diagram and a series of side cross-sectional views. The second embodiment is designated by the general reference character 500, and is shown to include a "Deposit Etch Mask Layer" step 502. A step 502 can include depositing an etch mask layer over a substrate that can be patterned by a subsequent step to form openings within an etch mask layer. One example of a device following step 502 is set forth in a side cross-sectional view in FIG. 6A. A sample device is designated by the general reference character 600 and is shown to include a substrate 602. Formed over substrate 602 is an etch mask layer 604.

Figure 6A:
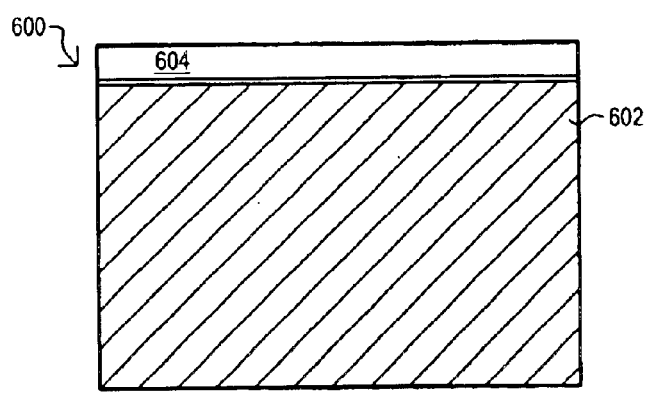
FIGS. 6A to 6F are side cross-sectional views of a STI structure made according to method steps described in FIG. 5.
Figure 6B:
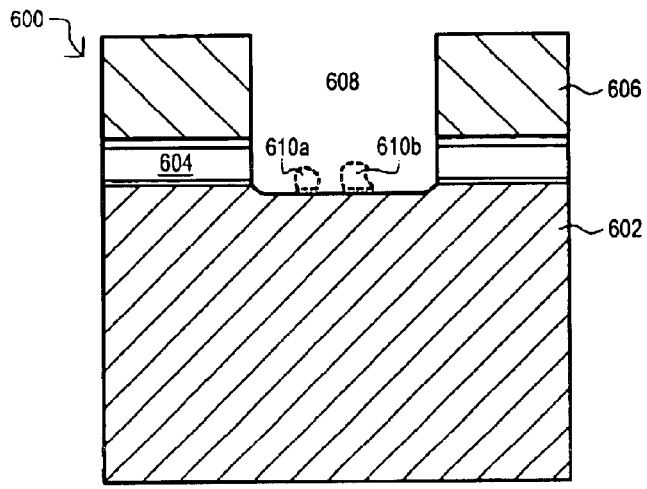

The second embodiment 500 further includes a "Pattern Etch Mask Layer" step 504. A step 504 can include developing a pattern over an etch mask layer that exposes portions of an etch mask layer. An etch can then be applied that removes exposed portions of an etch mask layer. One example of a device following step 504 is set forth in a side cross-sectional view in FIG. 6B. A sample device is designated by the general reference character 600 and is shown to include a substrate 602. Formed over an etch mask layer 604 is an etching pattern 606. Etching pattern 606 includes pattern opening 608. A portion of etch mask layer 604 below pattern opening 608 has been removed. FIG. 6B also includes possible particles 610a and 610b that could result from etching an etch mask layer 604.

It is understood that possible particles (610a and 610b) set forth in FIG. 6B are illustrative and should not be considered to be set forth in any particular scale, or to represent a particular shape, particular slope feature, or particular orientation. Previous etch steps could result in differently shaped and sized residual particles. As just one of the many possible examples, such particles could be attached to etch mask layer 604 by filament structures of the like. Furthermore, one skilled in the art would recognize that a previous etch step could produce no such particles. Accordingly, the second embodiment should in no way be construed as requiring the presence of particles, or particles of a particular shape.

Figure 6C:
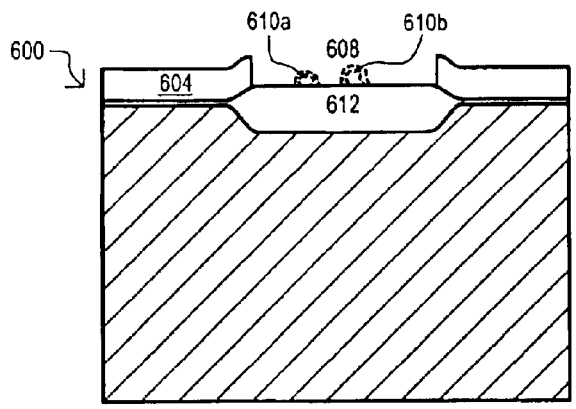
Figure 6D:
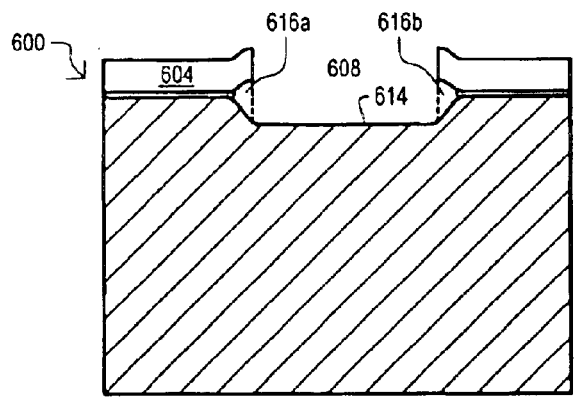
Figure 6E:
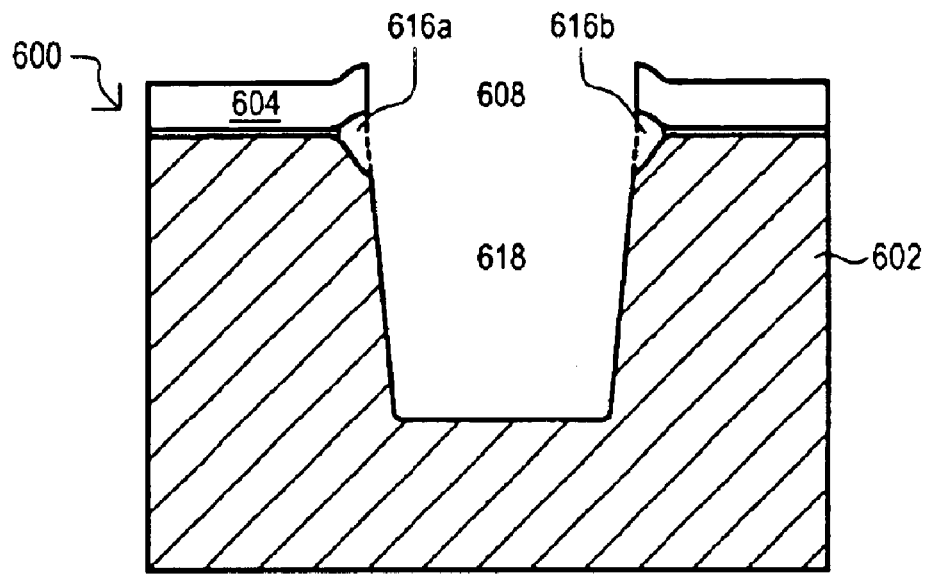
Figure 6F:
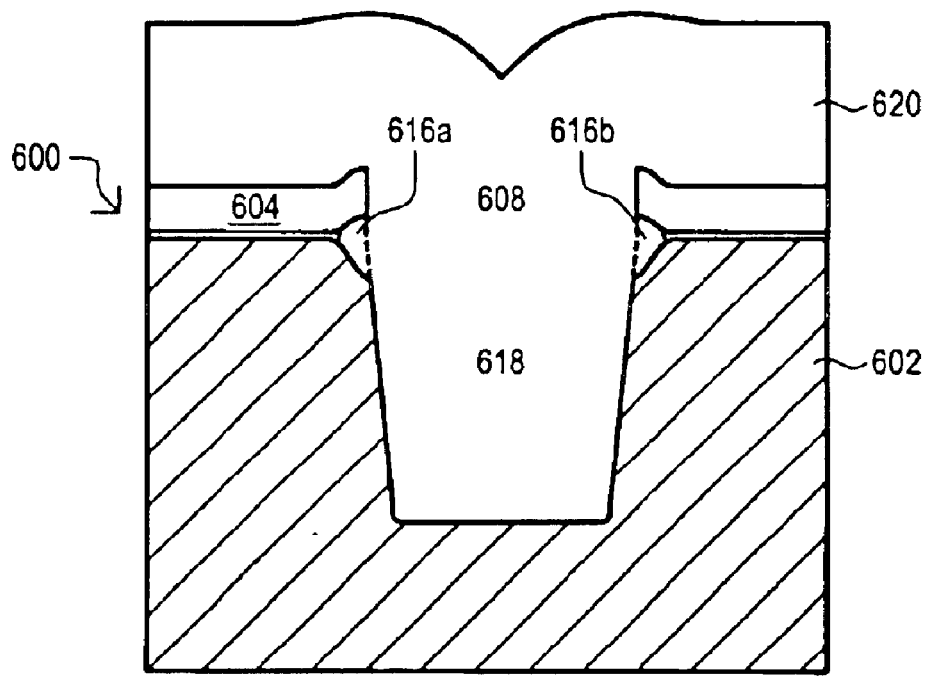

The second embodiment 500 further includes a "Form Substrate Consuming Layer Over Trench Location" step 504. A step 504 can include creating material on an exposed surface of a substrate that consumes a substrate as it is formed. A substrate consuming material can thus be created over a location where a trench can be formed. Forming such a substrate consuming layer can result in a relatively easier removal of any particles that might be present over a desired trench location. One example of a device following step 504 is set forth in a side cross-sectional view in FIG. 6C. In FIG. 6C substrate consuming layer 612 is formed on an exposed portion of substrate 602 at a location where a trench can be formed. Substrate consuming layer 612 extends into the substrate in a vertical direction in the view of FIG. 6C. Particles (610a and 610b) that might be present from an existing processing step are also illustrated in FIG. 6C. In the particular example of FIG. 6C, an etching pattern (such as that shown as item 606 in FIG. 6B) has been removed.

Flow diagram 500 also includes a "Remove Substrate Consuming Layer to Remove Defects if Present" step 508. A step 508 can include removing a substrate consuming layer by etching or the like. Once a substrate consuming layer is removed, particles that may have been present from previous processing steps can also be removed, and thereby present a substrate surface that can be more conducive to a subsequent etch step. One example of a device following step 508 is set forth in a side cross-sectional view in FIG. 6D. A substrate consuming material has been removed, leaving an exposed substrate etch surface 614. A structure 600 such as that set forth in FIG. 6D may or may not include encroaching portions (616*a* and 616*b*), depending upon the process used to remove a substrate consuming layer.

Figure 5:
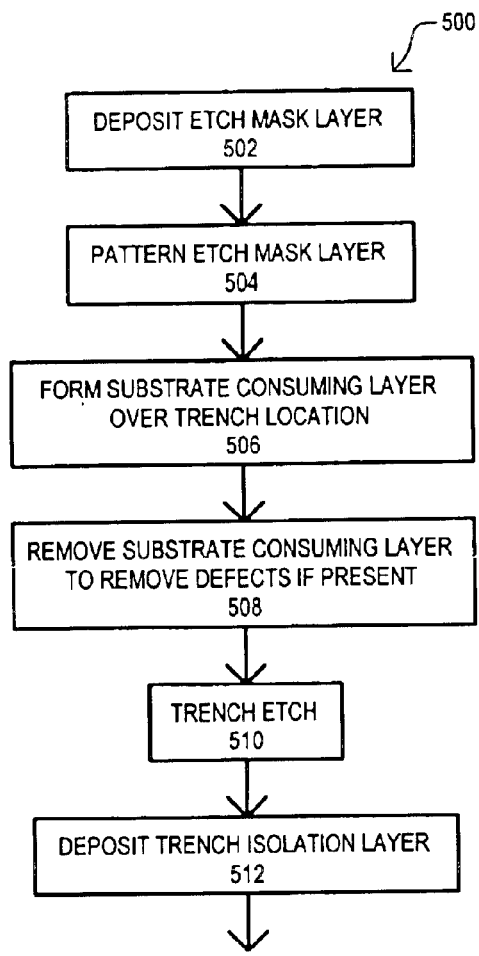
FIG. 5 is a flow diagram illustrating a STI method according to a second embodiment.

Another step set forth in FIG. 5 is a "Trench Etch" step 510. A step 510 can include etching a trench into a substrate using an etch mask. Exposed portions of a substrate below an etch mask opening can be removed to form an isolation trench. One example of a device following step 510 is set forth in a side cross-sectional view in FIG. 6E. Portions of a substrate 602 below an exposed substrate etch surface have been removed resulting in a trench 618. In the particular arrangement illustrated by FIG. 6E, residual portions (616*a* and 616*b*) may or may not remain, depending upon previous processing steps. A trench 618 can possess a desirable uniform side and bottom surface, which are free from, or less adversely affected by, micro-masking defects caused by particles or other such defects introduced by previous processing steps.

The second embodiment 500 further includes a "Deposit Trench Isolation Layer" step 512. A step 512 can include depositing a trench isolation layer that fills trenches within a substrate. One example of a device following step 512 is set forth in a side cross-sectional view in FIG. 6F. A trench isolation material 620 has been deposited that fills a trench in a substrate 602. A structure such as that illustrated by FIG. 6F may or may not include encroaching portions (616*a* and 616*b*).

Accordingly, the second embodiment 500 illustrates how an STI method may remove particles, or other such defects, which may be present over a substrate surface prior to a trench etching process. Such particles, or other such defects, may be removed by forming and removing a substrate consuming layer. Removal of such particles or other defects can reduce the effects of micro-masking defects.

Figure 7:
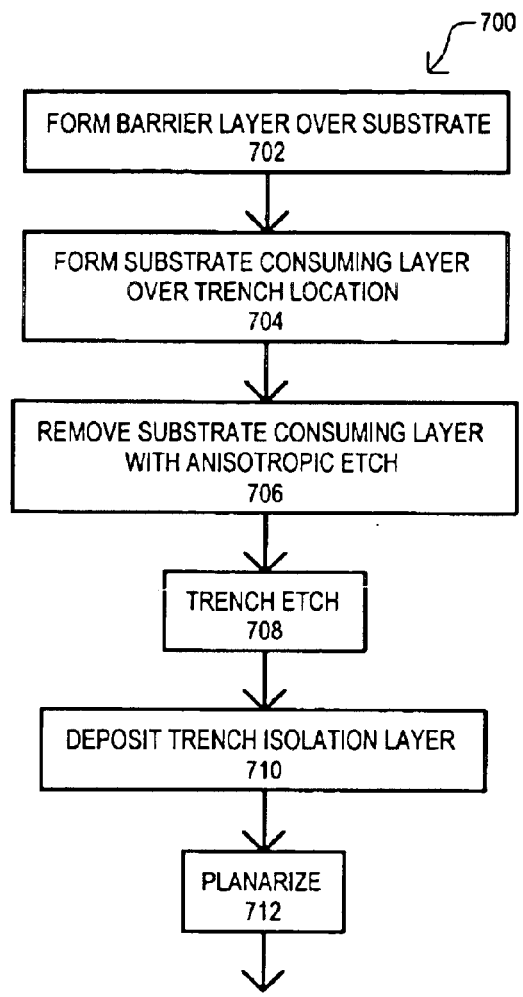
FIG. 7 is a flow diagram illustrating a STI method according to a third embodiment.

Referring now to FIG. 7 and FIGS. 8A–8F, a third embodiment is described in a flow diagram and a series of side cross-sectional views. The third embodiment is designated by the general reference character 700, and is shown in FIG. 7 to include a "Form Barrier Layer Over Substrate" step 702. A step 702 can include depositing a barrier layer over substrate, the barrier layer having openings therein. Openings can correspond to locations where an isolation trench may be formed. One example of a device following step 702 is set forth in a side cross-sectional view in FIG. 8A. The sample device is designated by the general reference character 800 and is shown to include substrate 802. Formed over substrate 802 is barrier layer 804 which can include barrier layer opening 806. Barrier layer opening 806 corresponds to a location where an isolation trench can be formed.

Figure 8A:
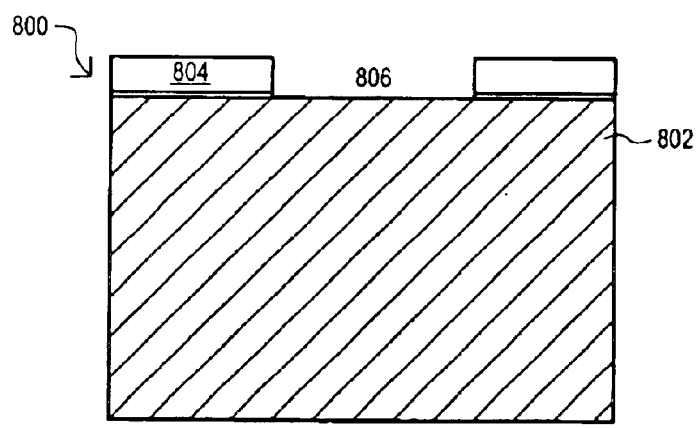
FIGS. 8A to 8F are side cross-sectional views of a STI structure made according to method steps described in FIG. 7.
Figure 8B:
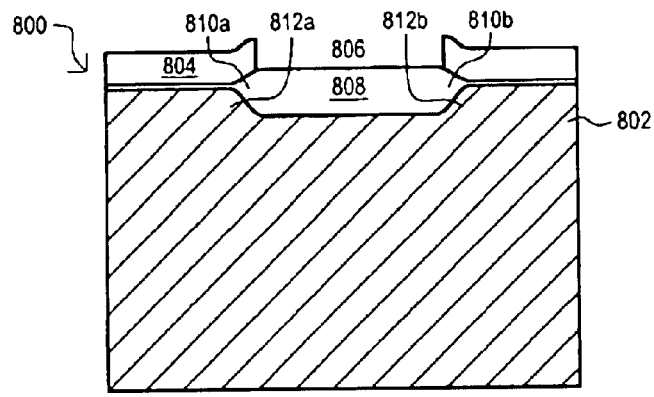

Flow diagram 700 is shown to further include a "Form Substrate Consuming Layer Over Trench Location" step 704. A step 704 can include forming a material on an exposed surface of a substrate that consumes portions of the substrate. A substrate consuming layer can be formed over a location where trench edges may be formed. One example of a device following step 704 is set forth in a side cross-sectional view in FIG. 8B. A substrate consuming material is shown as item 808, and in the particular example of FIG. 8B, is shown to extend into substrate 802 in a vertical direction. In addition, substrate consuming material 808 extends in a lateral direction under barrier layer 804. Formation of substrate consuming material below edges of barrier layer opening 806 can result in corner protection portions 810*a* and 810*b* situated over trench edge locations 812*a* and 812*b*.

Flow diagram 700 further includes a "Remove Substrate Consuming Layer with Anisotropic Etch" step 706. A step 706 can include removing a substrate consuming layer by applying a generally anisotropic etch. A generally anisotropic etch can remove portions of a substrate consuming layer while retaining corner protection portions above trench corner locations. One example of a device following step 706 is set forth in a side cross-sectional view in FIG. 8C. A substrate consuming material has been removed leaving corner protection portions (810*a* and 810*b*) over trench edge locations (812*a* and 812*b*). In the particular arrangement of FIG. 8C, a barrier layer 804 has been retained and used as a mask for an anisotropic etch. In this way, a substrate consuming layer 808 can be formed with a barrier layer 804 and portions of the barrier layer 804 removed in a self-aligned fashion.

Another step that is included in FIG. 7 is a "Trench Etch" step 708. A step 708 can include etching a trench into a substrate using a trench etch mask. Substrate material below a trench etch mask opening can be removed to form an isolation trench. A step 708 can resulting in a trench having edges that are formed below corner protection portions formed in previous process steps. One example of a device following step 708 is set forth in a side cross-sectional view in FIG. 8D. Portions of a substrate 802 below an exposed trench mask have been removed. The result is a trench 814. In the particular arrangement illustrated by FIG. 8D, a barrier layer 804 has been retained for use as a trench etch mask. A trench 814 can include trench corners 816*a* and 816*b* situated below corner protection portions (810*a* and 810*b*).

Figure 8C:
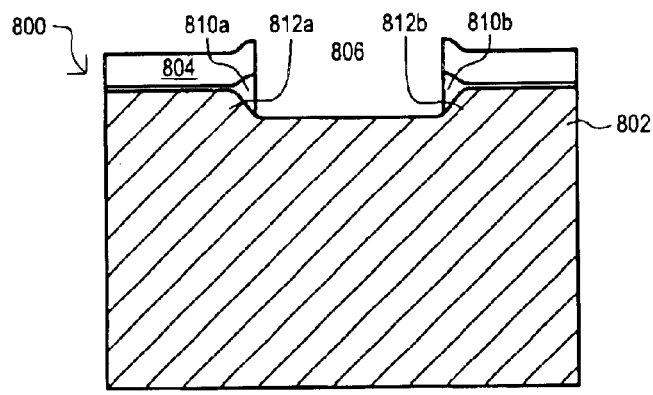
Figure 8D:
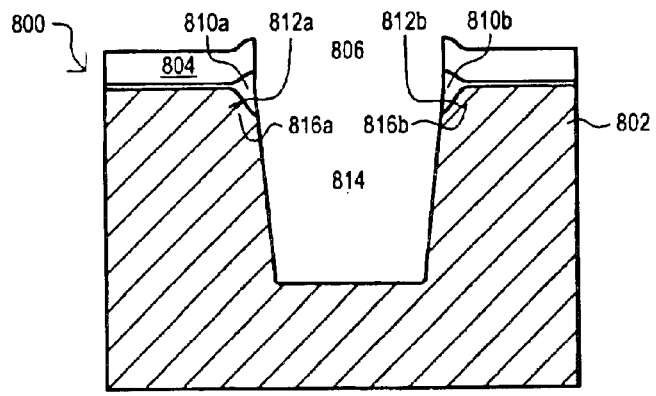
Figure 8E:
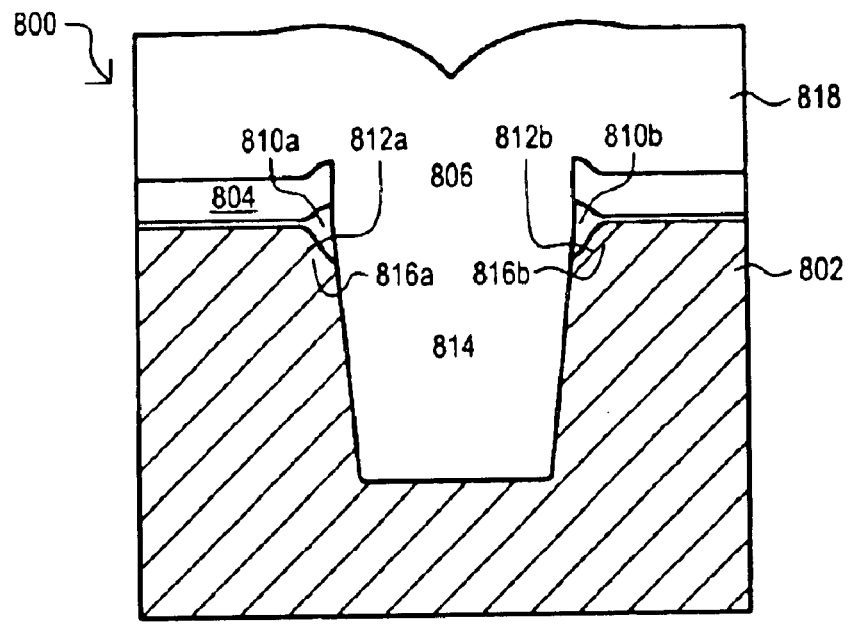

If reference is made to FIGS. 8B, 8C and 8D, it is shown that an STI method can include, as just one example, a barrier mask 804 having an opening 806 that serves to define the limits of a substrate consuming layer 808. Opening 806 can also serve as an etch mask for substrate consuming layer 808. Further, opening 806 can serve as an etch mask for a trench 814.

The third embodiment 700 further includes a "Deposit Trench Isolation Layer" step 710. A step 710 can include depositing a trench isolation layer that fills trenches within a substrate. One example of a device following step 710 is set forth in a side cross-sectional view in FIG. 8E. A trench isolation material 818 has been deposited that fills a trench 814 in a substrate 802. A structure such as that illustrated by FIG. 8E can include corner protection portions (810*a* and 810*b*) over trench corners (816*a* and 816*b*).

Figure 8F:
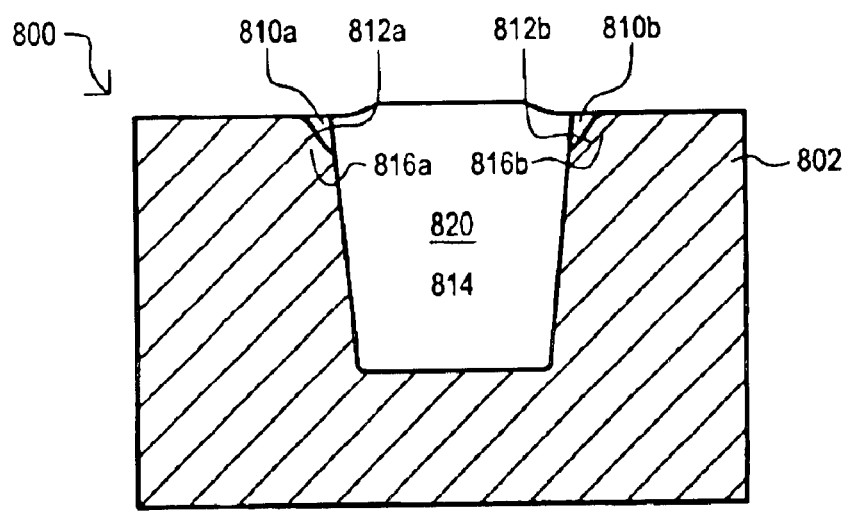

The third embodiment 700 further includes a "Planarize" step 712. A step 712 can include processes that planarize a structure having shallow trench isolation to produce a planar surface. Planar surfaces can be conducive to subsequent fabrication steps. One example of a device following step 712 is set forth in a side cross-sectional view in FIG. 8F. In the particular structure of FIG. 8F, much of a trench isolation material has been removed resulting in a generally planar surface. Trench isolation material 820 is situated within trench 814. Also included in FIG. 8F are corner protection portions (810*a* and 810*b*) situated above trench corners (816*a* and 816*b*).

Corner protection portions (810*a* and 810*b*) can provide protection for trench corners (816*a* and 816*b*) from subsequent etch operations that can degrade the performance of a resulting semiconductor device. As just one example, in the event the substrate consuming material is an insulating material, corner protection portions (810*a* and 810*b*) can help to ensure that a sufficient insulating material thickness covers trench corners (816*a* and 816*b*). In the event insulated gate field effect transistors (IGFETs) are formed within a substrate 802, insufficient insulating layer thickness at the corner of STI structures can lead to undesirable increases in sub-threshold current (i.e., a transistor with a "hump" sub-threshold response).

Figure 9:
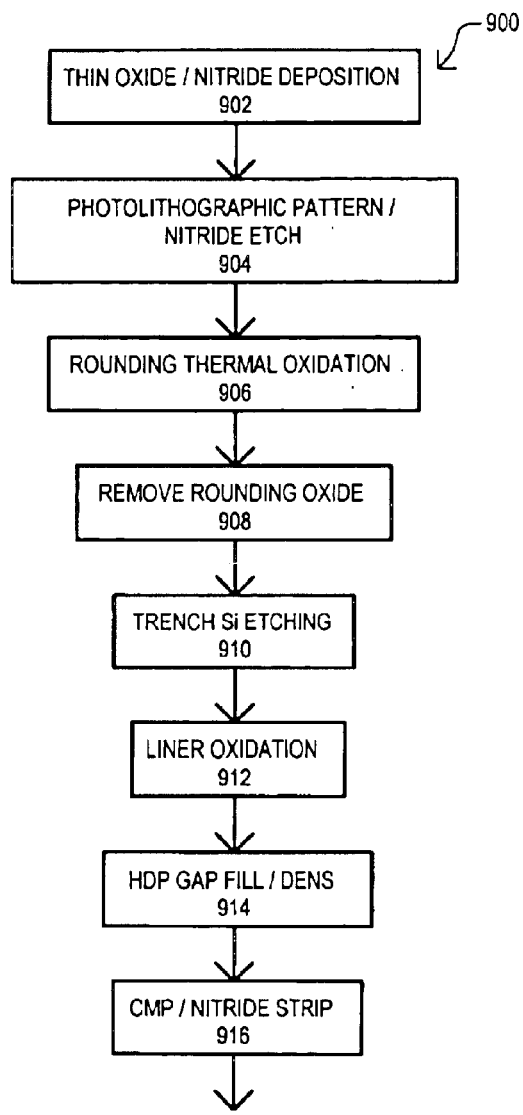
FIG. 9 is a flow diagram illustrating a STI method according to a fourth embodiment.

Referring now to FIG. 9, a fourth embodiment is set forth in a flow diagram and designated by the general reference character 900. The fourth embodiment 900 sets forth a STI method that can be used to produce isolation structures in an integrated circuit device formed in a generally monocrystalline semiconductor substrate. An example of a STI structure that can result from an approach such as the fourth embodiment 900 will be described in a series of side cross-sectional views in FIGS. 10A to 10H-2.

The fourth embodiment 900 is shown to include a "Thin Oxide/Nitride Deposition" step 902. A step 902 can include the formation of a thin oxide layer on a silicon substrate. Possible ways in which a thin oxide can be formed include "wet" oxidation and/or "dry" oxidation, which oxidize the silicon surface to create a thin layer of silicon dioxide (referred to hereinafter as "oxide"). Such a thin layer of oxide has been referred to as sacrificial oxide (SAC OX) in some cases.

A step 902 can further include the deposition of a silicon nitride (referred to hereinafter as "nitride") layer over a thin oxide layer. A nitride layer, when patterned, can provide a number of functions. A patterned nitride layer can function as a barrier layer for subsequent substrate oxidation step. Alternatively, a patterned nitride layer can function as an etch mask for the formation of a trench in a subsequent trench etch step. In the particular STI approach set forth in FIG. 9, a patterned nitride layer functions as a barrier to a subsequent oxidation step formed over a trench location, and as an etch mask for forming a trench.

Figure 10A:
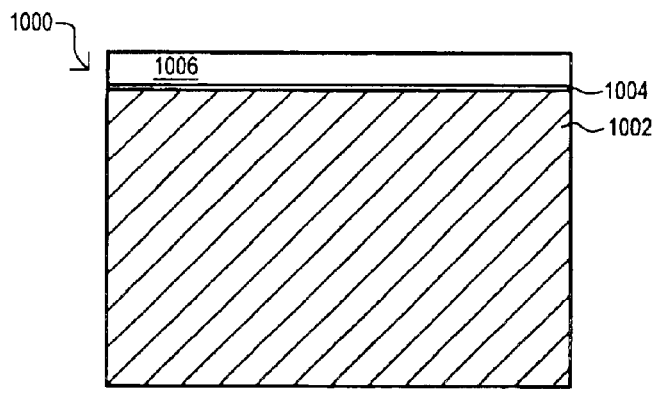

Referring now to FIG. 10A, a side cross-sectional view is set forth of a STI structure following a step 902. A STI structure is designated by the general reference character 1000, and is shown to include a monocrystalline silicon substrate 1002. A thin oxide layer 1004 is shown formed on a top surface of substrate 1002. A thin oxide layer 1004 may have a thickness of about 100 angstroms (A). Also shown in FIG. 10A is a nitride layer 1006 formed over a thin oxide layer 1004. The nitride layer 1006 can have a thickness of about 1500 Å.

The particular method described in FIG. 9 further includes "Photolithographic Pattern/Nitride Etch" step 904. A step 904 can include forming a layer of anti-reflective coating (ARC) and a layer of photoresist. A photoresist layer can then be developed to form a pattern having openings in locations where a nitride layer is to be removed. In the event such a nitride layer is to serve as an etch mask for a trench etch step, a photoresist layer can include openings in locations where an isolation trench can be formed. It is understood that photolithographic patterning presents one approach to producing an etch pattern for a nitride layer. Such an approach can include various conventional photolithographic approaches, as well as approaches using phased-shift photolithography. Alternate patterning approaches could also be employed. A few examples of alternate patterning approached includes higher wavelength lithography, such as X-ray lithography, or patterning using accelerated particles, such as electron-beam (E-Beam) lithography.

A step 904 can also include a nitride etch following the creation of nitride etch mask. A nitride etch can remove exposed portions of a nitride layer. In addition, a nitride etch can remove any thin oxide below the exposed portions of a nitride layer. Still further, a nitride etch can remove a portion of a substrate below the exposed portion of a nitride layer. In the event a portion of a substrate is removed, a gouge can be created that extends into a substrate surface.

Figure 10B:
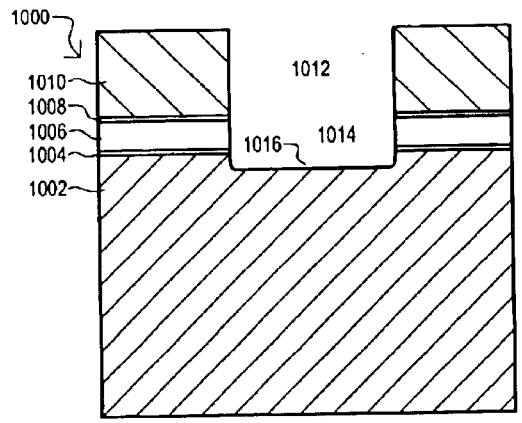

Referring now to FIG. 10B, a side cross-sectional view of a STI structure 1000 following a step 904 is set forth. An ARC layer 1008 is shown to be formed on nitride layer 1006. Photoresist 1010 is formed over ARC layer 1008. A photoresist opening 1012 is formed in photoresist 1010 by a developing and removal procedure. In the particular arrangement of FIG. 10B, opening 1012 is situated over a trench location. Furthermore, in the particular structure of FIG. 10B, a nitride etch has etched through nitride layer 1006, thin oxide layer 1004, and into substrate 1002. An etch mask opening 1014 has been formed in a nitride layer 1006, and a gouge 1014 can be formed in substrate 1012.

A gouge 1014 such as that set forth in FIG. 10B can have a depth of about 300 Å. However, it is understood that a gouge 1016 may be shallower or deeper according to the particular nitride etch used and/or existing process controls on the nitride etch. Thus, a gouge 1016 can have a depth in the range of 0–2000 Å. A 0 Å gouge depth can indicate a nitride etch that has terminated before a substrate 1002 surface. As just one example, a nitride etch may terminate at or within a thin oxide layer 1004 on the substrate 1002 surface.

A fourth embodiment 900 can also include a "Rounding Thermal Oxidation" step 906. A step 906 can include oxidizing an exposed portion of a substrate to form a thermal rounding oxide layer. An oxidizing step can be, as just two examples, a "wet" oxidation step in which an exposed portion of the substrate is exposed to steam at an elevated temperature, or alternatively, a "dry" oxidation step in which an exposed portion of the substrate is exposed to an oxygen containing atmosphere at an elevated temperature. A rounding oxide layer can consume a silicon substrate in forming a silicon dioxide layer. As a result, a rounding oxide layer can extend into a substrate, and can extend above a substrate. In addition, a patterned nitride mask can function as an oxidation barrier layer, limiting the lateral extents of a resulting rounding oxide layer. It is also noted that a step 906 can further include a resist strip step in which a patterned layer of photoresist is removed.

Figure 10C:
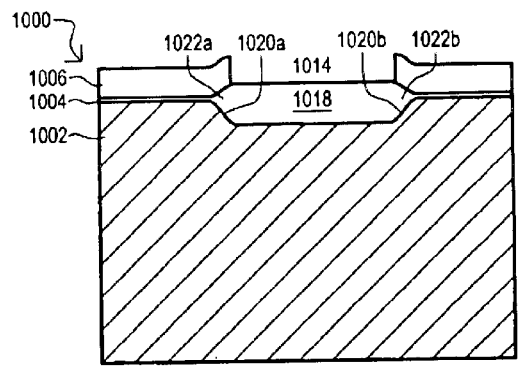

Referring now to FIG. 10C, a STI structure 1000 following a step 906 is set forth. A rounding oxide 1018 is formed below etch mask opening 1014. Nitride layer 1006 serves as a barrier layer in an oxidation process limiting the encroachment of rounding oxide 1018 in the horizontal direction in FIG. 10C. Lateral extents of a rounding oxide layer 1018 can result in a substrate surface having rounded edges 1020*a* and 1020*b*. In the event a trench is to be formed below etch mask opening 1014, rounded edges (1020*a* and 1020*b*) can form rounded trench edges. A rounding oxide 1018 can also include encroaching portions 1022*a* and 1022*b* over rounded edges (1020*a* and 1020*b*). A resulting rounding oxide can have a thickness, at a thickest portion, that is about 500 Å. However rounding effects can occur at other thickness ranges. For example, a rounding oxide 1018 can have a thickness in the range of 300–4000 Å.

FIG. 10C illustrates one way in which the formation of a rounding oxide 1018 can produce rounded edges (1020*a* and 1020*b*) in silicon substrate surface 1002. If a trench is subsequently etched into a substrate 1002, such rounded edges (1020a and 1020b) can serve as rounded trench edges. Rounded trench edges may reduce electric fields at trench edges, or reduce stress on the edges that can lead to increased crystal lattice dislocations, or both.

Another step that can be included in an STI method according to a fourth embodiment 900 is a "Remove Rounding Oxide" step 908. A step 908 can include applying an etch that removes rounding oxide to expose a substrate surface. An etch that removes a rounding oxide can be isotropic or anisotropic. In an isotropic rounding oxide etch, a substrate surface can be exposed. In addition, all or a significant portion of, any encroaching portions can be removed. One way to accomplish an isotropic rounding oxide etch is to use a wet chemical etch, such as a buffered oxide etch (BOE). In an anisotropic rounding oxide etch, a substrate surface can be exposed while all, or a significant portion of, any encroaching portions are retained. An anisotropic rounding oxide etch can be a reactive plasma etch, such as a reactive ion etch (RIE), to name but one example.

Thus, an STI method according to the fourth embodiment 400 can also include a "Remove Rounding Oxide" step 908 that can employ an anisotropic etch, or alternatively, an etch having varying degrees of isotropy. Accordingly, an STI method can include additional process flexibility, as an STI structure can formed using different etch approaches. It is also noted that residual particles or other such defects that can be present over a substrate prior to the formation of a rounding oxide. Such residual particles or other such defects can result in micro-masking defects in the event subsequent etch steps are employed. The formation of a rounding oxide on a substrate, and subsequent removal of a rounding oxide, may remove or assist in the removal of such particles or other defects.

Figure 1:
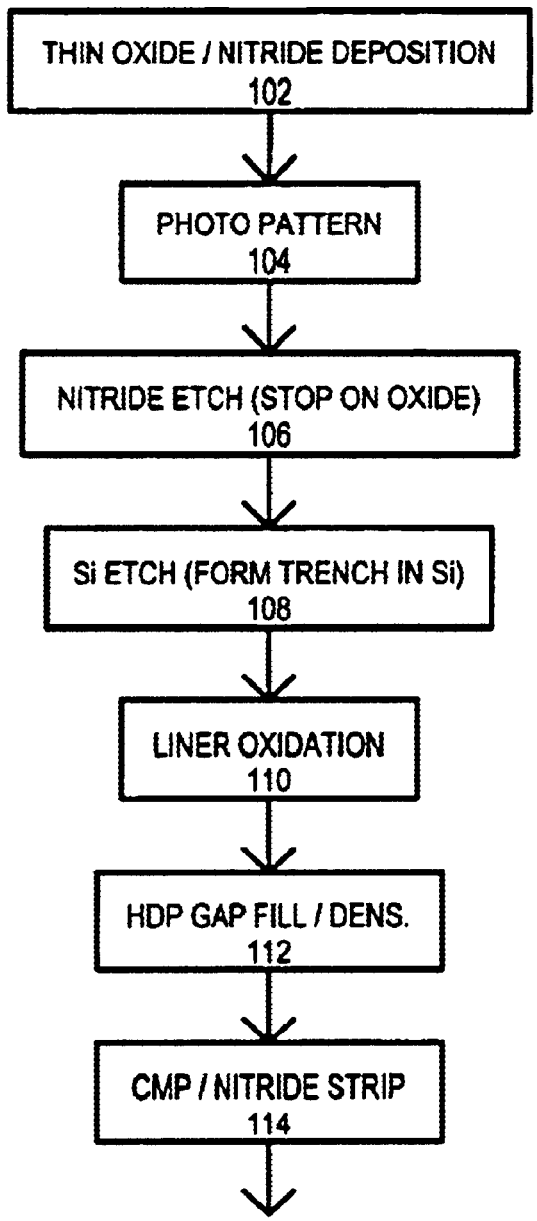
FIG. 1 is a flow diagram illustrating a conventional shallow trench isolation (STI) method.
Figure 2A:
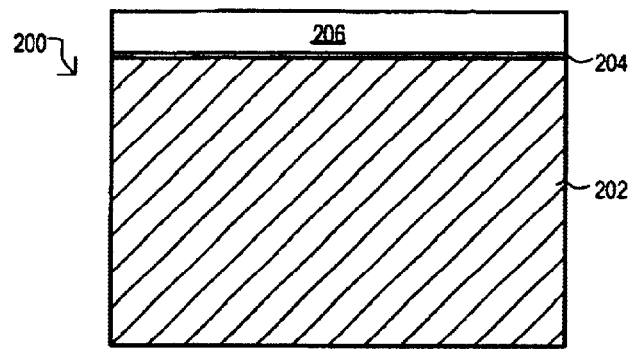
FIGS. 2A–2G are side cross-sectional views illustrating the formation of a conventional STI structure according to the method set forth in FIG. 1.
Figure 2B:
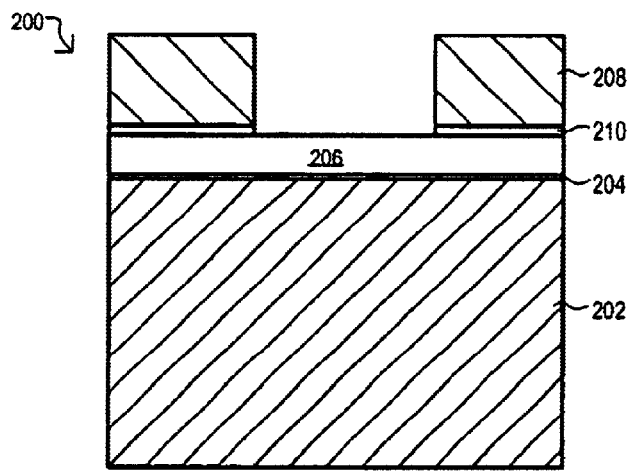
Figure 2C:
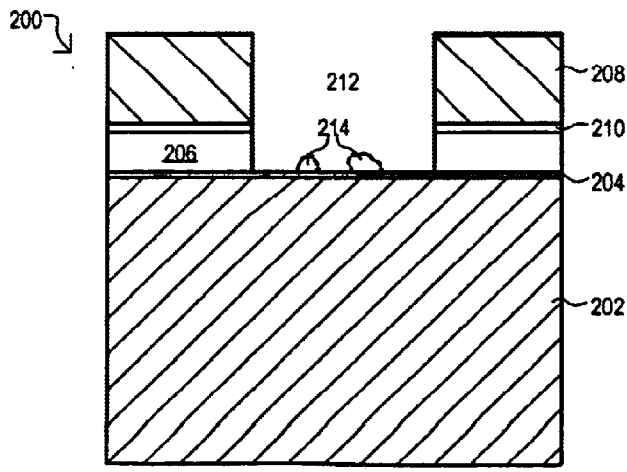
Figure 2D:
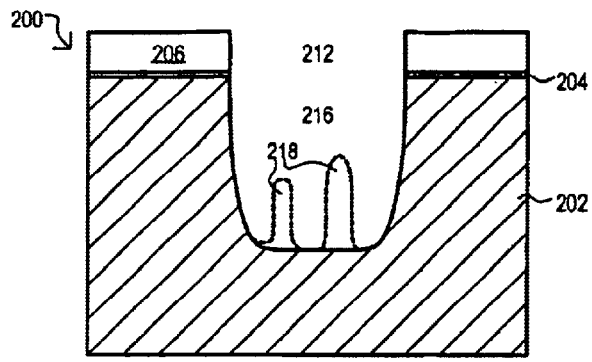
Figure 2E:
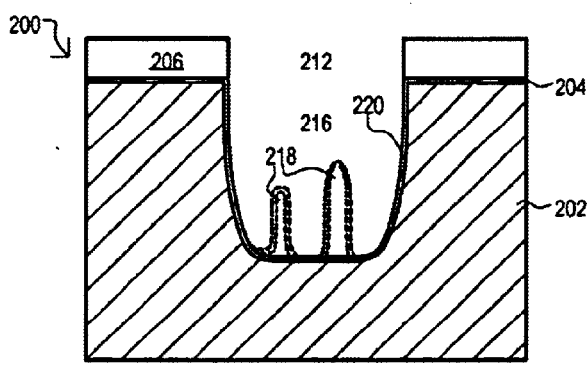
Figure 2F:
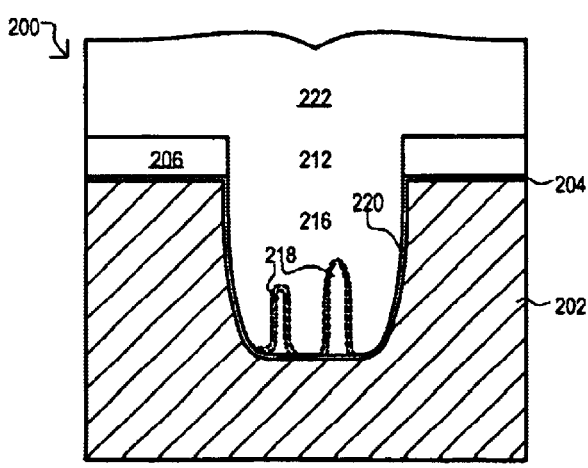
Figure 2G:
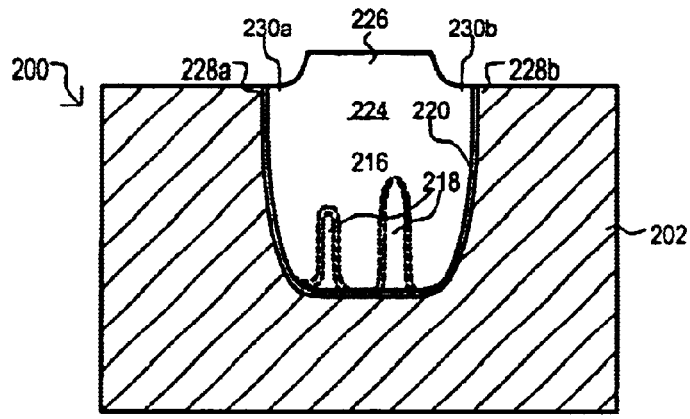
Figures 1, 10D:
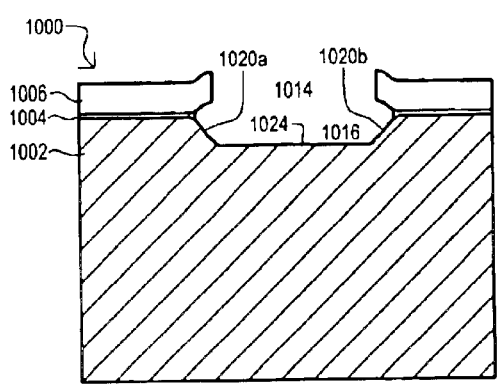

Referring now to FIG. 10D-1, a STI structure 1000 following a step 908 is set forth in a side cross-sectional view. The structure 1000 of FIG. 10C-1 represents the results of an isotropic rounding oxide etch. An isotropic etch has exposed a bottom surface of substrate 1002. Encroaching portions have been removed exposing rounded edges (1020a and 1020b). Following a removal of rounding oxide, a silicon gouge 1016 can remain. However, because a rounding oxide can consume portions of the substrate, a gouge 1016 can have an increased depth. As just one example, a gouge can have a depth of about 400 Å. However, as noted above, a gouge can have a varying depth in the range of 0–2000 Å.

Figures 2, 10D:
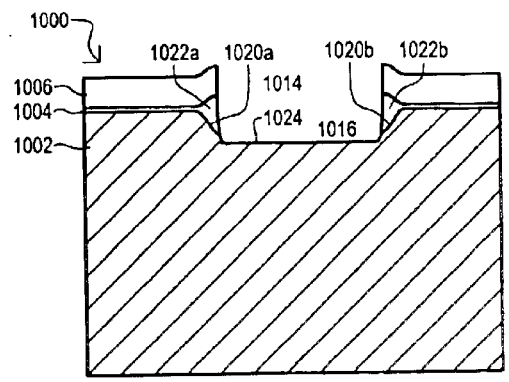

In contrast, FIG. 10D-2 illustrates a STI structure 1000 following a step 908 in which an anisotropic rounding etch has been applied. In the particular example of FIG. 10D-2, a nitride layer 1006 having etch mask opening 1014 functions as an etch mask. A rounding oxide has been removed, exposing bottom surface 1024 of substrate 1002. However, encroaching portions (1022a and 1022b), situated over rounded edges (1020a and 1020b), remain. Results of an anisotropic etch can be similar to the isotropic case discussed above. A silicon gouge 1016 can remain having a depth of about 400 Å. However, according to previous process steps, a gouge can have a varying depth in the range of 0–2000 Å.

Yet another step set forth in FIG. 9 is a "Trench Si Etching" step 910. A step 910 can include having a trench etch mask over a silicon substrate, and then applying a silicon etch. A trench etch mask will include mask openings over desired trench locations, and a silicon etch can be a reactive plasma etch, such as REI. The REI etch can have a recipe that is selective to silicon. An etch mask for the trench etch can be a nitride layer formed in a previous step. The end result of a step 910 can be the formation of an isolation trench within a substrate.

Figures 1, 10E:
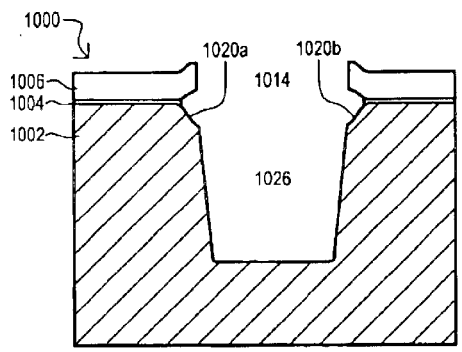
Figures 2, 10E:
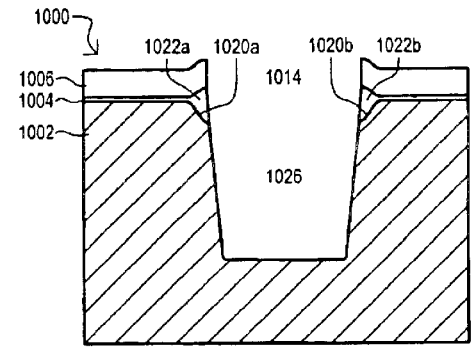

Referring now to FIG. 10E-1, a STI structure 1000 following a step 910 is set forth in a side cross-sectional view. The structure 1000 of FIG. 10E-1 represents a particular example of an STI structure that has been previously subjected to an isotropic rounding oxide etch. A nitride layer 1006 having etch mask opening 1014 has served as an etch mask. As a result, a portion of substrate 1002 situated below etch mask opening 1014 has been removed, resulting in a trench 1026. Previously formed rounded edges (1020a and 1020b) now serve as rounded trench edges. A silicon etch can form a trench having a depth of about 3600 Å. However, a trench depth may vary according to process controls and isolation needs. Accordingly, a trench depths can range from 0–8000 Å.

FIG. 10E-2, like FIG. 10E-1, illustrates a STI structure 1000 following a step 910. However, the structure 1000 of FIG. 10E-2 represents a particular example of an STI structure that has previously been subjected to an anisotropic rounding oxide etch. In the particular arrangement of FIG. 10E-2, a nitride layer 1006 having etch mask opening 1014 has served as an etch mask. Consequently, a portion of substrate 1002 below opening 1014 has been removed, forming a trench 1026. Previously formed rounded edges (1020a and 1020b) now form rounded trench edges. Furthermore, because encroaching portions (1022a and 1022b) are situated below edges of nitride layer 1006, encroaching portions (1022a and 1022b) are retained. A trench such as that set forth in FIG. 10E-2 can provide desired isolation effects with a depth of about 3600 Å. However, as noted above, alternate trench depths can have ranges of 0–8000 Å.

Another step included in FIG. 9 is a "Liner Oxidation" step 912. A step 912 can include subjecting a formed trench to an oxidizing environment to produce a relatively thin oxide layer around the surfaces of a trench. A liner oxidation can include a wet oxidation step, a dry oxidation step, or some combination thereof.

Figures 1, 10F:
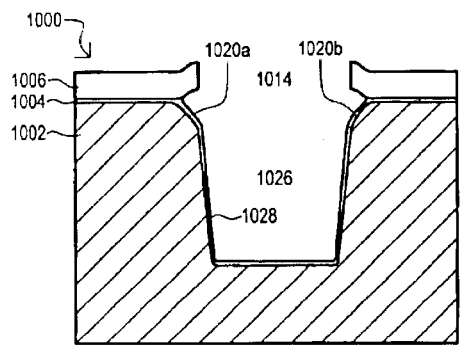
Figures 2, 10F:
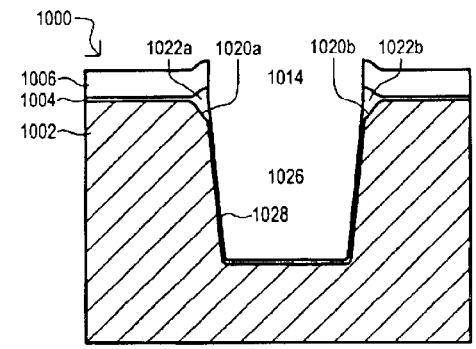

FIG. 10F-1 is a side cross-sectional view of a STI structure 1000 following a liner oxidation step. The particular structure 1000 of FIG. 10F-1 has been previously subjected to an isotropic rounding oxide etch. A liner oxidation step results in the surfaces of a trench 1026 being lined with a relatively thin layer of liner oxide 1028. The particular structure 1000 also includes a liner oxide 1028 over rounded edges (1020a and 1020b) of trench 1026. A liner oxide can have a thickness of about 300 Å, as just one possible example.

FIG. 10F-2 is also a side cross-sectional view of a STI structure 1000 following a liner oxidation step. However, the particular structure 1000 of FIG. 10F-2 has been previously subjected to an anisotropic rounding oxide etch. A liner oxide 1028 covers the surfaces of a trench 1026. Encroaching portions (1022a and 1022a) remain disposed above rounded edges (1020a and 1020b). As in the structure of FIG. 10F-1, the liner oxide 1028 of FIG. 10F-1 can have a thickness of about 300 Å.

It is noted that liner materials for a trench, such as liner oxide 1028, are not necessarily restricted to silicon dioxide. Alternate materials, or material combinations can be employed. As just one example, a nitride layer can be deposited, or a combination oxide-nitride layer formed, or a combination oxide-nitride-oxide layer formed.

The fourth embodiment 900 of FIG. 9 is shown to further include a "HDP Gap Fill/DENS" step 914. A step 914 can include depositing an isolation material that fills trenches, and thereby creates a STI structure. A step 914 can further include, as one particular example, depositing an oxide, using a high density plasma (HDP). High density plasma can be use tetraethoxysilane (TEOS). A deposited oxide layer that fills a trench can subsequently be densified.

Figures 1, 10G:
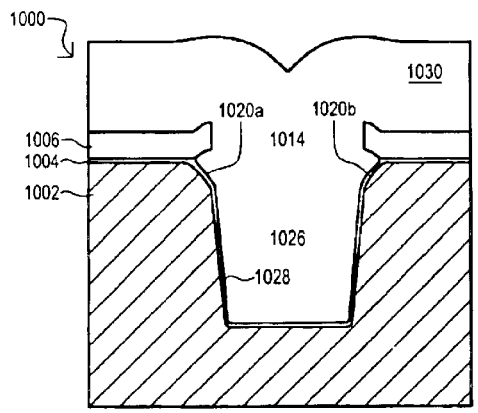
Figures 2, 10G:
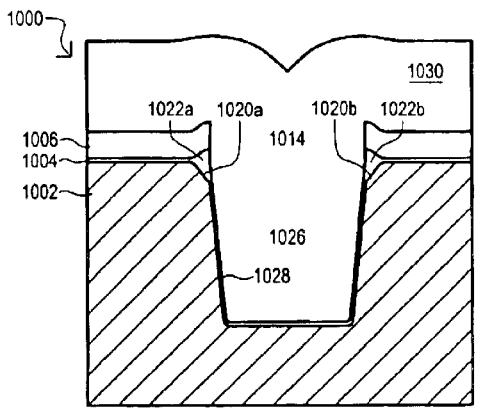

FIG. 10G-1 is a side cross-sectional view of a STI structure 1000 following a step 914. The STI structure 1000 of FIG. 10G-1 has been previously subjected to an isotropic etch that has removed a rounding oxide layer. A step 914 has resulted in an isolation material 1030 that fills a trench 1026. In the particular arrangement of FIG. 10G-1, isolation material 1030 is also situated over substrate 1002. In addition, areas above rounded edges (1020a and 1020b) can be filled by isolation material 1030.

FIG. 10G-2 is also side cross-sectional view of a STI structure 1000 following a step 914. However, the STI structure 1000 of FIG. 10G-2 has been previously subjected to an anisotropic etch that has removed a rounding oxide layer. Consequently, encroaching portions (1022a and 1022b) remain disposed over rounded trench edges (1020a and 1020b). An isolation material 1030 has filled a trench 1026, and like the particular arrangement of FIG. 10G-1, isolation material 1030 is further situated over substrate 1002.

Another step set forth in FIG. 9 is a "CMP/Nitride Strip" step 916. A step 916 can include planarizing an STI structure to produce a more uniform device surface. One way to planarize is to employ chemical-mechanical polishing (CMP). A step 916 can further include a nitride strip step that removes a nitride layer, if present.

FIG. 10H-1 is a side cross-sectional view of a STI structure 1000 following a step 916. The structure 1000 is has been previously subjected to an isotropic rounding oxide etch. Following a planarization and nitride strip, an STI structure 1000 includes a relatively planar silicon substrate 1002 surface. A trench 1026, filled with an isolation material 1030, is set within a planar surface. A trench 1026 can further include rounded edges (1020a and 1020b). Particular planarization approaches can result in a stud 1032 that extends a relatively small amount above a planar surface.

FIG. 10H-2 is also side cross-sectional view of a STI structure 1000 following a step 916. The structure 1000 of FIG. 10H-2 has been previously subjected to an anisotropic rounding oxide etch. Consequently, following a planarization step and nitride strip, an STI structure 1000 can include a trench 1026 having encroaching portions (1022a and 1022b) over rounded trench edges (1020a and 1020b). A trench 1026 can be filled with an isolation material 1030. Like the structure set forth in FIG. 10H-1, particular planarization approaches can result in a stud 1032 that extends a relatively small amount above a planar surface. However, a stud in the structure of FIG. 10H-2, may be smaller than in other approaches. A smaller stud may result as encroaching portions (1022a and 1022b) can provide additional protection to rounded corners (1020a and 1020b). Such additional protection can allow planarization to continue past the end points of other planarization approaches. In addition, additional protection can prevent unwanted thinning of insulation material above rounded corners (1020a and 1020b) that can occur in subsequent oxide etching steps.

It is noted that the particular structures illustrated in FIGS. 10A to 10H-2 include self-aligned steps. Self-alignment can result in more efficient manufacturing of a semiconductor device and/or smaller achievable geometries. As one example, a patterned nitride layer 1006 can serves as a barrier layer for the formation of a rounding oxide 1018, and then as an etch mask for a rounding oxide removal step. In another example, a patterned nitride layer 1006 can serve as an etch mask for a rounding oxide removal step, and then as an etch mask for a trench etch step. In another example, a patterned nitride layer 1006 can serve as a barrier layer for the formation of rounding oxide 1018, as an etch mask for a rounding oxide removal step, and as an etch mask for a trench etch step.

In this manner, an STI structure can be created using a fourth embodiment. Such a structure may include one or more of the following features. A rounding oxide formation and removal step may remove undesirable particles. Rounded trench edges may provide more desirable active device characteristics, or current leakage characteristics, or improved reliability. Encroaching portions over rounded trench corners may enable a more planar STI structure, or a STI structure that is more robust for subsequent oxide etch steps.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of forming an isolation structure in a substrate, the method comprising the steps of:

etching a barrier layer to form at least one barrier opening;

forming a substrate consuming layer below the at least one barrier opening that includes a top surface that extends above the substrate top surface;

isotropically etching at least a portion of the substrate consuming layer to form a top portion of an isolation trench in the substrate, the isolation trench electrically isolating active devices from one another;

removing a second portion of the substrate to form a bottom portion of the isolation trench below the top portion of the trench;

depositing an isolation material in the trench; and planarizing a resulting surface so that a top surface of the isolation material is substantially even with a top surface of the substrate.

2. The method of claim 1, further including:

forming the barrier layer over the substrate.

3. The method of claim 2, wherein:

the stop of forming a barrier layer includes depositing a layer of silicon nitride and etching at least one opening in the layer of silicon nitride.

4. The method of claim 3, wherein:

the step of forming a barrier layer further includes etching the surface of the substrate disposed below the at least one opening and forming a gouge in the surface of the substrate.

5. The method of claim 1, wherein:

the step of forming a substrate consuming layer includes oxidizing a portion of the substrate below the at least one opening.

6. The method of claim 5, wherein:

the step of oxidizing a portion of the substrate forms rounded edges in the surface of the substrate.

7. The method of claim 5, wherein:

the substrate includes silicon; and the stop of oxidizing a portion of the substrate includes forming a layer of silicon dioxide having lateral extents that are limited by the at least one opening in the barrier layer.

8. The method of claim 1, wherein:

the step of removing the second portion of the substrate includes substantially anisotropically etching the substrate.

9. The method of claim 8, wherein:

the substrate consuming layer includes silicon dioxide having encroaching portions that extend below edges of the at least one opening;

isotropically etching at least a portion of the substrate consuming layer substantially removes the encroaching portions.

10. The method of claim 1, wherein:

the substrate includes silicon; and the step of forming the top portion of the isolation trench includes etching selectively the substrate while the barrier layer remains over the substrate.

11. The method of claim 1, wherein:

the substrate include silicon; and the step of depositing an isolation material includes depositing silicon dioxide from a high density plasms.

12. The method of claim 11, further comprising densifying the deposited silicon dioxide.

13. The method of claim 1, further including:

planarizing the resulting surface.

14. The method of claim 13, wherein:

the step of planarizing includes chemical-mechanical polishing.

15. The method of claim 1, further including:

depositing an isolation material into the isolation trench.

16. The method of claim 1, wherein:

the stop of isotropically etching at least a portion of the substrate consuming layer includes wet chemically etching the substrate consuming layer.

17. A method of shallow trench isolation comprising the steps of:

forming a barrier layer having at least one opening;

oxidizing a silicon containing substrate to form a layer of silicon dioxide below the at least one opening, the silicon dioxide extending into the substrate and having rounded corners;

anisotropically etching at least a portion of the silicon dioxide layer below the at least one opening to form a gouge in the substrate, the gouge having rounded edges and residual portions of the silicon dioxide layer above the rounded edges;

forming an isolation trench in the silicon substrate within the gouge to a depth substantially deeper than the gouge, the rounded edges of the gouge forming top edges for the isolation trench, the isolation trench electrically isolating active devices from one another;

filling the isolation trench with an isolation material; and planarizing a resulting surface so that a top surface of the isolation material is substantially even with a top surface of the substrate.

18. The method of claim 17 wherein:

the step of forming the isolation trench includes etching the substrate with the barrier layer in place over the substrate.

19. A shallow trench isolation (STI) structure, comprising:

an isolation trench formed in a silicon substrate that electrically isolates active devices from one another, the isolation trench including a rounded trench edge formed by oxidizing the silicon substrate that joins a side surface of the trench with a top surface of the silicon substrate, the side surface of the isolation trench being a silicon-etched side surface formed by etching the silicon substrate after oxidizing the silicon substrate; and a trench isolation layer formed within the isolation trench adjacent to the rounded trench edge and the trench side surface having a top surface that is substantially even with a top surface of the substrate, the trench isolation layer including an isolation encroaching portion extending toward a top silicon substrate surface from the rounded trench edge and essentially coplanar with the top silicon substrate surface, the isolation encroaching portion formed from oxidized silicon substrate material.

20. The STI structure of claim 19, wherein:

the trench isolation layer comprises deposited high density plasma silicon dioxide.

* * * * *